(12) United States Patent
Kotik

(10) Patent No.: US 10,991,990 B2
(45) Date of Patent: Apr. 27, 2021

(54) LOW PROFILE SENSOR AND ELECTROCHEMICAL CELL INCLUDING SAME

(71) Applicant: Robert Bosch GmbH, Stuttgart (DE)

(72) Inventor: Mark Kotik, Rochester Hills, MI (US)

(73) Assignees: Robert Bosch Battery Systems LLC, Orion, MI (US); Robert Bosch GmbH, Stuttgart (DE)

( * ) Notice: Subject to any disclaimer, the term of this patent is extended or adjusted under 35 U.S.C. 154(b) by 31 days.

(21) Appl. No.: 16/078,611

(22) PCT Filed: Apr. 10, 2017

(86) PCT No.: PCT/EP2017/058500
§ 371 (c)(1),
(2) Date: Aug. 21, 2018

(87) PCT Pub. No.: WO2017/182307
PCT Pub. Date: Oct. 26, 2017

(65) Prior Publication Data
US 2019/0013554 A1  Jan. 10, 2019

Related U.S. Application Data

(60) Provisional application No. 62/324,089, filed on Apr. 18, 2016, provisional application No. 62/324,103, filed on Apr. 18, 2016.

(51) Int. Cl.
*H01M 10/48* (2006.01)
*H01M 10/42* (2006.01)

(52) U.S. Cl.
CPC ... *H01M 10/4257* (2013.01); *H01M 10/4207* (2013.01); *H01M 10/482* (2013.01);
(Continued)

(58) Field of Classification Search
CPC .......... H01M 10/0525; H01M 10/052; H01M 10/4257; H01M 10/4207; H01M 10/482
See application file for complete search history.

(56) References Cited

U.S. PATENT DOCUMENTS

| 9,209,497 B2 | 12/2015 | Elian et al. |
| 2006/0019155 A1* | 1/2006 | Seman, Jr. ............ H01M 2/204 429/159 |

(Continued)

FOREIGN PATENT DOCUMENTS

| CN | 102171907 | 8/2011 |
| DE | 10118027 | 11/2005 |

(Continued)

OTHER PUBLICATIONS

PCT International Search Report for PCT/EP2017/058500.

*Primary Examiner* — Olatunji A Godo
(74) *Attorney, Agent, or Firm* — Kelly McGlashen; Maginot, Moore & Beck, LLP (57) ABSTRACT

An electrochemical cell has a flexible low-profile sensor device that includes a solid state device or series of solid state devices on a common carrying material that enable the device(s) to sense battery cell conditions and actively perform cell control functions. At least a portion of the sensor device resides outside the cell. When arranged in a stack, cells including the sensor automatically form a communication network.

15 Claims, 5 Drawing Sheets

(52) U.S. Cl.
   CPC ............... *H01M 2010/4271* (2013.01); *H01M 2010/4278* (2013.01)

(56) References Cited

U.S. PATENT DOCUMENTS

| | | |
|---|---|---|
| 2007/0082233 A1 | 4/2007 | Shen et al. |
| 2010/0136392 A1* | 6/2010 | Pulliam ................. G01K 1/026 429/90 |
| 2010/0182154 A1* | 7/2010 | Kawai ................. H01M 10/425 340/636.1 |
| 2010/0273044 A1 | 10/2010 | Culver et al. |
| 2012/0301747 A1 | 11/2012 | Han et al. |
| 2014/0076622 A1 | 3/2014 | Neudecker et al. |
| 2014/0121557 A1 | 5/2014 | Gannon et al. |
| 2014/0184162 A1 | 7/2014 | Takahashi et al. |
| 2016/0028128 A1 | 1/2016 | Limvorapun |
| 2016/0141728 A1* | 5/2016 | Fauteux ................ H01M 2/204 429/61 |

FOREIGN PATENT DOCUMENTS

| | | |
|---|---|---|
| EP | 2328173 | 3/2016 |
| JP | 2014-143903 | 8/2014 |
| JP | 2016-505808 | 2/2016 |
| KR | 1020150066560 | 12/2016 |
| WO | 199905746 | 2/1999 |
| WO | 2008101107 | 8/2008 |
| WO | 2010038136 | 8/2010 |
| WO | 2011028695 | 3/2011 |
| WO | 2012062574 | 5/2012 |
| WO | WO2014206323 | * 12/2014 |
| WO | 2016057318 | 4/2016 |

\* cited by examiner

LOW PROFILE SENSOR AND
ELECTROCHEMICAL CELL INCLUDING
SAME

This application is a 35 U.S.C. § 371 National Stage Application of PCT/EP2017/058500, filed Apr. 10, 2017, which claims the benefit of U.S. Provisional Patent Application Nos. 62/324,089, filed on Apr. 18, 2016, and 62/324,103, filed on Apr. 18, 2016, the disclosures of which are incorporated herein by reference in their entirety.

FIELD

The disclosure relates generally to an electrochemical cell having a low profile sensor that includes a solid state device or series of solid state devices on a common carrying material and that detects battery cell conditions and actively performs cell control functions.

BACKGROUND

Battery packs provide power for various technologies ranging from portable electronics to renewable power systems and environmentally friendly vehicles. For example, hybrid electric vehicles (HEV) use a battery pack and an electric motor in conjunction with a combustion engine to increase fuel efficiency. Battery packs are formed of a plurality of battery modules, where each battery module includes several electrochemical cells. Within the battery modules, the cells are arranged in two or three dimensional arrays and are electrically connected in series or in parallel. Likewise, the battery modules within a battery pack are electrically connected in series or in parallel.

SUMMARY

In some aspects, a low-profile sensor device includes a solid state device or series of solid state devices that are disposed on a common carrier. The solid state device(s) enable the sensor device to sense battery cell conditions such as voltage and temperature and also provide the ability to actively perform functions such as drain battery cell energy in order to enable state of charge balancing in a series string of battery cells. In some embodiment, the sensor device may be at least partially embedded within the cell. In other embodiments, the sensor device is disposed on an outer surface of the cell.

In some aspects, a single electrode pair electrochemical cell includes an anode foil substrate having a first active material pasted on an inward facing side, a cathode foil substrate having a second active material pasted on an inward facing side, a separator sheet disposed between the anode and the cathode, a sealing material such as a hot melt sealant or pressure sensitive adhesive that is disposed along the perimeter of the foils, and an electrolyte sealed between the substrates by the sealing material. The substrates act as an impermeable layer, enclosure and electrodes. Thus, as used herein, the terms "substrate" and "electrode" are interchangeable. The sealing material layer between the electrodes extends around their perimeter to secure the electrodes in place and prevent electrical shorts between the electrodes. The single electrode pair electrochemical cell is extremely thin and thus presents issues for how to practically attach sense leads and discrete devices in order to connect the cell to a battery management system (BMS). This is because some conventional sense leads are much bulkier than the single electrode pair electrochemical cell, making it difficult to sense cell conditions.

In some embodiments, a sensor device that addresses this difficulty includes at least one semiconductor and a flexible circuit board that are used to externally mount battery cell sensing electronics in a small, low profile circuit board that also maintains traditional communication systems and methods for communicating with electronic devices. Additionally, the communication network is automatically created during assembly process without the addition of external wiring.

In some embodiments, a sensor device that addresses this difficulty includes a solid state device or series of solid state devices that are disposed on a common carrier. The solid state device(s) enable the sensor device to sense battery cell conditions such as voltage and temperature and also provide the ability to actively perform functions such as drain battery cell energy in order to enable state of charge balancing in a series string of battery cells.

In some embodiments, a sensor device that addresses this difficulty includes at least one semiconductor and a flexible circuit board that are used to mount battery cell sensing electronics in a small, low profile circuit board that also maintains traditional communication systems and methods for communicating with electronic devices. In particular, the sensor portion of the sensor device is placed directly into the ultra-thin battery cell without the need to implement discrete or direct wiring to a BMS. In some embodiments, the sensor portion is embedded within the sealing material used to join the electrodes so as to reside between the electrodes.

In some aspects, an electrochemical cell includes a single positive electrode that forms a first portion of an outer surface of the cell and provides a positive cell terminal, and a single negative electrode that forms a second portion of an outer surface of the cell and provides a negative cell terminal. The electrochemical cell includes a separator that is disposed between the positive electrode and the negative electrode, wherein the positive electrode, the negative electrode and the separator are arranged in a stacked configuration. The electrochemical cell includes a sealing material layer that connects and forms a seal between a peripheral edge of the positive electrode and a peripheral edge of the negative electrode, and a sensor device including circuit board and an electronic device that is supported on the circuit board, the electronic device including a sensor and a communication device. The sensor device is in physical contact with, and electrically connected to, one of the positive electrode and the negative electrode, and at least a first portion of the sensor device is disposed outside the cell.

The electrochemical cell may include one or more of the following features: The sensor device includes a second portion that includes an electrically conductive sensor contact pad that is electrically connected to the sensor, and the second portion of the sensor device is disposed on an outer surface of the cell. The first portion of the sensor device includes an electrically conductive contact pad that is electrically connected to the communication device. The sensor contact pad is entirely disposed within the cell. The sensor contact pad is embedded within the sealing material layer. The sensor device includes a second portion that includes an electrically conductive sensor contact pad that is electrically connected to the sensor, and the second portion of the sensor device is disposed between, and physically contacts both, the positive electrode and the negative electrode. The sensor contact pad includes a first sensor contact pad that is electrically connected to the positive electrode and a second sensor contact pad that is connected to the negative electrode. The first portion of the sensor device includes an electrically conductive transmitter contact pad that is electrically connected to a transmitter, and an electrically conductive receiver contact pad that is electrically connected to a receiver. The circuit board is flexible. The electronic device is an integrated circuit that is configured to perform at least one of battery cell monitoring function and battery cell control function.

In some aspects, a battery module includes electrochemical cells disposed in a stacked configuration, and sensor devices. Each sensor device is electrically connected to a unique one of the electrochemical cells, and each sensor device physically contacts, and forms an electrical connection with, the sensor device of an adjacent electrochemical cell so as to automatically form a communication network.

The battery module may include one or more of the following features: Each sensor device includes a circuit board and communication device that is supported on a first side of the circuit board, the communication device including at least one of a transmitter and a receiver, each sensor device includes an electrically conductive first contact pad disposed on the first side of the circuit board and an electrically conductive second contact pad disposed on a second side of the circuit board, the first contact pad is electrically connected to the communication device, the first contact pad and the second contact pad are electrically connected by a via that passes through the circuit board from the first side to the second side, and one of the first and second contact pads of one electrochemical cell is physically touching and electrically connected to one of the first and second contact pads of an adjacent electrochemical cell, whereby at least a portion of a communication network is automatically formed.

The battery module may also include one or more of the following features: Each sensor device is powered by the unique one of the electrochemical cells to which the sensor device is connected. Each sensor device is configured to be powered upon formation of a serial connection between adjacent sensor devices. Each electrochemical cell includes a single positive electrode that forms a first portion of an outer surface of the cell and provides a positive cell terminal, a single negative electrode that forms a second portion of an outer surface of the cell and provides a negative cell terminal, and a separator that is disposed between the positive electrode and the negative electrode, wherein the positive electrode. The negative electrode and the separator are arranged in a stacked configuration. Each electrochemical cell includes a sealing material layer that connects and forms a seal between a peripheral edge of the positive electrode and a peripheral edge of the negative electrode, and each sensor device includes a circuit board and a sensor that is supported on the circuit board. The sensor device is in physical contact with, and electrically connected to, one of the positive electrode and the negative electrode, and at least a first portion of the sensor device is disposed outside the cell.

The battery module may also include one or more of the following features: The sensor device of a given unique one of the electrochemical cells is disposed on an outer surface of, and physically contacts, one of the positive electrode and the negative electrode of the given unique one of the electrochemical cells, and the sensor device of the given unique one of the electrochemical cells physically contacts the other one of the positive electrode and the negative electrode of an adjacent electrochemical cell, whereby the sensor device is powered by the given unique one of the electrochemical cells and the adjacent electrochemical cell. A portion of the sensor device of a given unique one of the electrochemical cells is disposed between, and physically contacts both, the positive electrode and the negative electrode, whereby the sensor device is powered by the given unique one of the electrochemical cells to which the sensor device is connected. The battery module includes a module housing, and the electrochemical cells are disposed within the module housing.

DETAILED DESCRIPTION

Figure 1:
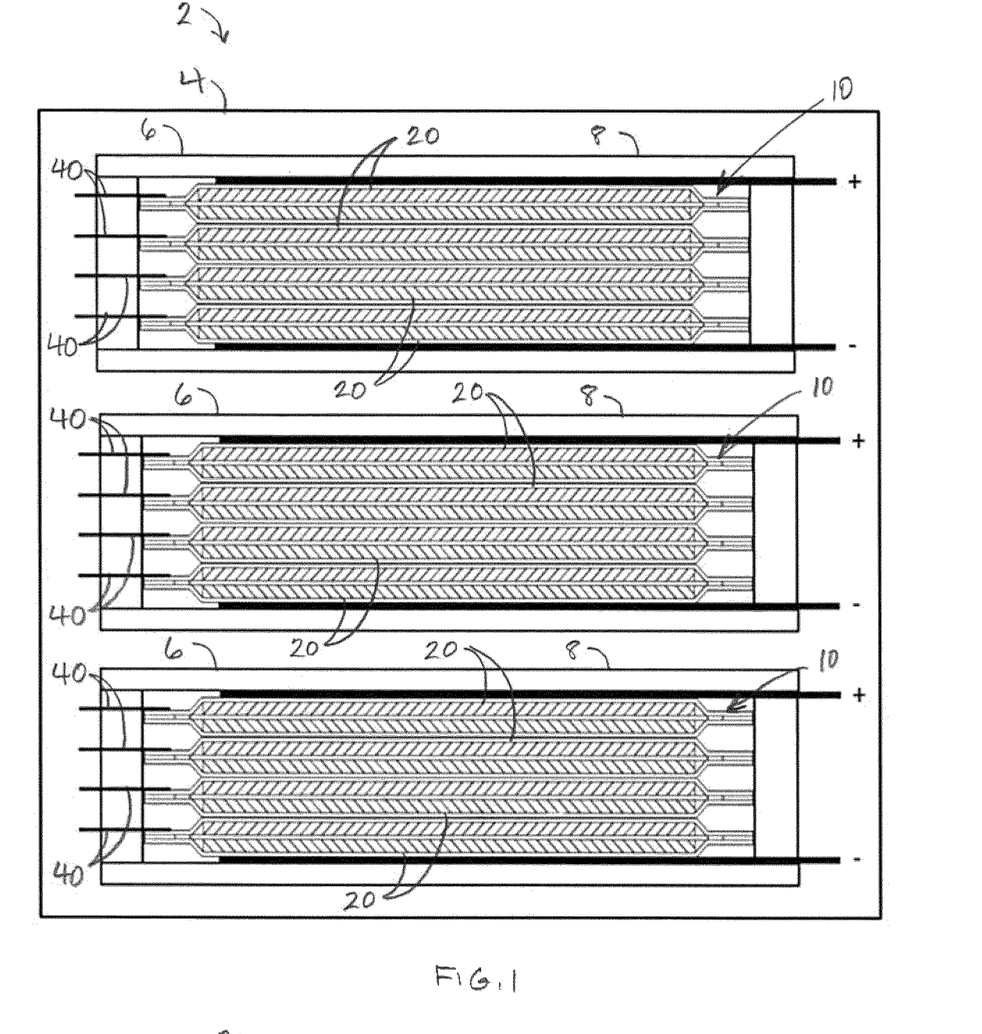
FIG. 1 is a schematic cross-sectional view of a battery pack including battery modules, each battery module including four single electrode pair cells.
Figure 2:
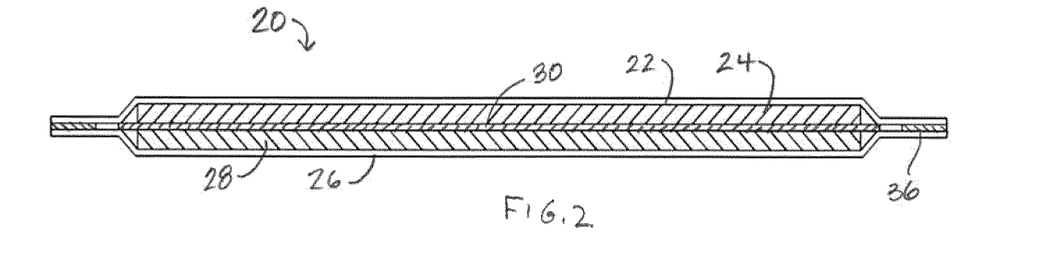
FIG. 2 is a cross-sectional view of single electrode pair cell.

Referring to FIGS. 1 and 2, a battery module 6 is a power generation and storage device that includes electrochemical cells 20 that are electrically interconnected and stored in an organized manner within a battery module housing 8. For example, the cells 20 may be arranged one on top of the other to form a cell stack 10. Although the cells 20 may be electrically connected in series or in parallel within the battery module housing 8, the stacked arrangement lends itself to forming a series electrical connection between the cells 20 of the stack 10. Several battery modules 6 may be disposed in a battery pack housing 4 to form a battery pack 2, and within the battery pack housing 4, the battery modules 6 are electrically connected in series or in parallel. A flexible sensor device 40 is secured to each cell 20 that can be used to form a communication network between cells 20 of the module and/or between the cells 20 and other devices. The flexible sensor device 40 is described in detail below.

The single layer cell 20 is a lithium ion cell that includes a single positive electrode 22, a single separator 30 and a single negative electrode 26 that are arranged in a layered conductor-separator-conductor configuration. The positive electrode 22 includes a first foil substrate formed of a first electrically-conducive material and having a first active material layer 24 disposed on an inward facing side. For example, the positive electrode 22 may be formed of a copper foil and include a graphite active material layer 24 disposed on the inward facing side. The negative electrode 26 includes second foil substrate formed of a second electrically-conductive material and having a second active material layer 28 disposed on an inward facing side. For example, the negative electrode 26 may be formed of an aluminum foil and include a lithiated metal oxide active material layer 28 disposed on the inward facing side.

The cell 20 includes the separator 30 disposed between the positive and negative electrodes 22, 26. The separator 30 is a permeable membrane that functions to keep the positive and negative electrodes 22, 26 apart to prevent electrical short circuits while also allowing passage of ionic charge carriers provided in the electrolyte and that are needed to close the circuit during the passage of current within the cell 20. The separator 30 is formed of an electrically insulating material such as, for example, a trilayer polypropylene-polyethylene-polypropylene membrane.

A sealing material layer 36 such as a hot melt sealant or pressure sensitive adhesive is disposed along the perimeter 23, 27 of the positive and negative electrodes 22, 26, and an electrolyte is sealed between the positive and negative electrodes 22, 26 by the sealing material. The sealing material layer 36 is disposed between the substrates which form the positive and negative electrodes 22, 26 around their perimeter to secure the substrates in place and prevent electrical shorts between the substrates.

Since the cell 20 is formed of a stacked arrangement of the positive and negative electrodes 22, 26 and separator 30, the cell 20 is very thin relative to some conventional cells. As a non-limiting example of cell thickness, in some embodiments, the cell 20 may have a thickness corresponding to a distance between the positive and negative electrode outer surfaces in a range of 0.5 mm to 1.5 mm. In other embodiments, the cell 20 may have a thickness in a range of 0.2 mm to 0.5 mm.

In the illustrated embodiment, four cells 20 are arranged within the module housing 8 in a stacked configuration. It is contemplated, however, that the cell stack 10 may include a greater or fewer number of cells, as required by the specific application. For example, in some embodiments, the cell stack 10 may include about one hundred cells 20 or more. The module housing 8 includes a positive (+) bus bar 52, a negative (−) bus bar 54.

Figure 3:
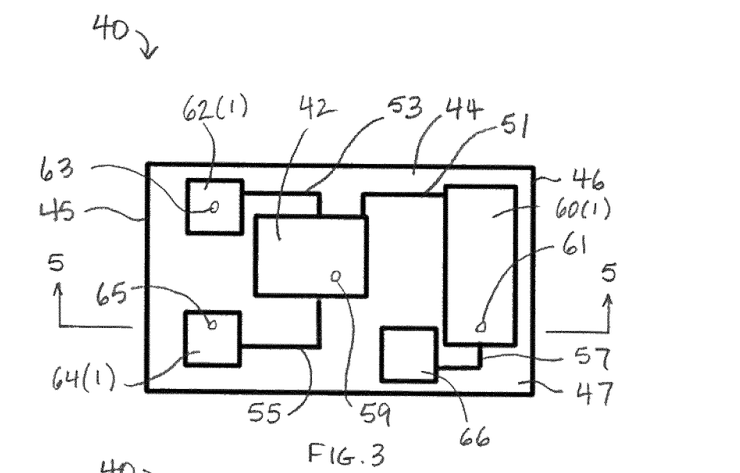
FIG. 3 is a top plan view of a sensor device.
Figure 4:
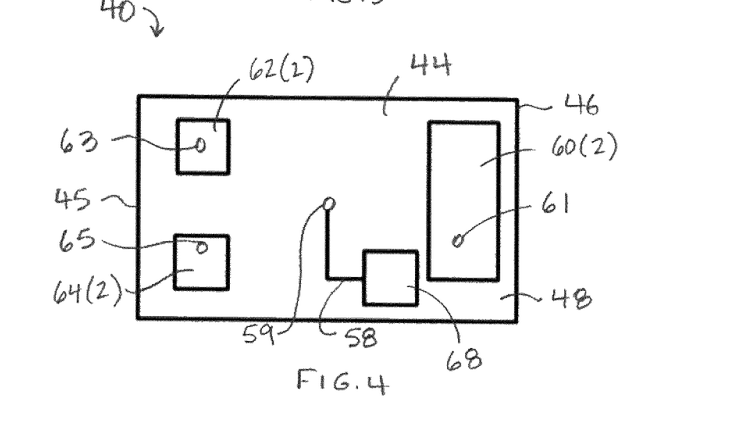
FIG. 4 is a bottom plan view of the sensor device of FIG. 3.
Figure 5:
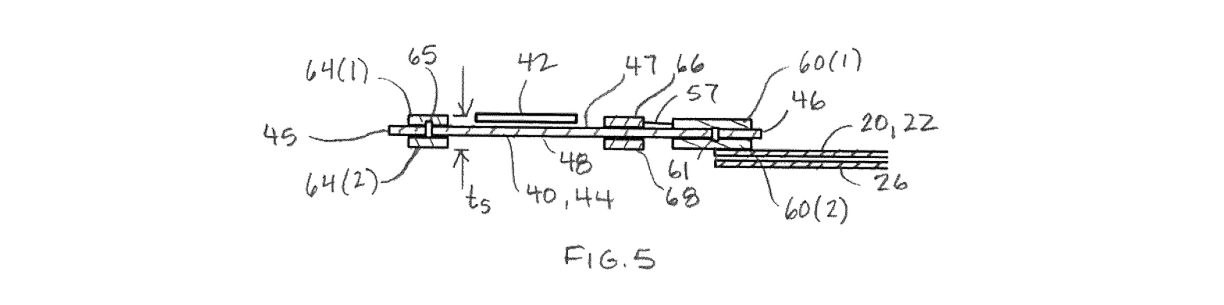
FIG. 5 is a schematic cross-sectional view of the sensor device of FIG. 3 assembled with a cell.

Referring to FIGS. 3-5, a sensor device 40 is connected to at least one of the cells 20 of the module 6. The sensor device 40 is a flexible, low profile device that permits detection of battery cell conditions such as voltage and temperature, and also provides the ability to actively perform functions such as draining of the battery cell energy in order to enable state of charge balancing in a series string of battery cells. In addition, the sensor device 40 is configured so that when multiple cells 20 are arranged in a stacked configuration, the respective sensor devices 40 automatically form a communication network without the need for manual connection, welding, etc. These and other features are described in detail below.

The sensor device 40 includes a carrier in the form of a flexible circuit board 44 and electronic devices 42 supported on the circuit board 44. The electronic devices 42 may include, but are not limited to, one or more integrated circuits (IC) or application specific integrated circuits (ASIC). In the illustrated embodiment, a single electronic device 42 in the form of an IC is provided. The electronic device 42 includes one or more sensors configured to detect temperature, battery voltage, etc., a transmitter that transmits information generated by the sensor(s) to an external device such as a battery monitoring system (BMS) (not shown), and a receiver that receives information including instructions from the BMS.

In the illustrated embodiment, the circuit board 44 is formed of a thin, flexible, electrically insulating material. In addition, the circuit board 44 is generally rectangular in shape when seen in top plan view. The circuit board 44 may have a layered structure and be formed of at least two layers.

The sensor(s), the transmitter and the receiver each include corresponding electrical contact pads 60, 62, 64 on each of the opposed sides 47, 48 of the circuit board 44. The electrical contact pads 60, 62, 64 are formed of an electrically conductive material such as copper, and are provided on outward facing surfaces of the outermost layers of the circuit board 44.

The sensor contact pads 60 enable the sensor device 40 to perform voltage sensing and/or temperature sensing. In addition, the sensor contact pads 60 enable the sensor device 40 to draw energy from the cell in order to power the IC 42 and/or balance the cell 20 by discharging it. In particular, the sensor(s) include a first sensor contact pad 60(1) that is disposed on a first surface 47 of the circuit board 44 and a second sensor contact pad 60(2) that is disposed on a second surface 48 of the circuit board 44. The first sensor contact pad 60(1) is electrically connected to the second sensor contact pad 60(2) by a via 61 that passes through the circuit board 44. The first and second sensor contact pads 60(1), 60(2) enable electrical connection to the substrate of one of the positive and negative electrodes 24, 26, as discussed further below. The first sensor contact pad 60(1) is electrically connected to the electronic device 42 by an electrically conductive first trace 51 that is provided on the first surface 47 of the circuit board 44.

The transmitter contact pads 62 and receiver contact pads 64 enable the sensor device 40 to have serial communication with other sensor devices of the cell stack 10 and with a master controller such as the BMS. In addition, the transmitter and receiver contact pads 62, 64 enable formation of a communication network within the cell stack 10.

The transmitter includes a first transmitter contact pad 62(1) that is disposed on the circuit board first surface 47 and a second transmitter contact pad 62(2) that is disposed on the circuit board second surface 48. The first transmitter contact pad 62(1) is electrically connected to the second transmitter contact pad 62(2) by a via 63 that passes through the circuit board 44. The first and second transmitter contact pads 62(1), 62(2) enable electrical connection to and communication with the transmitter of an identical sensor device 40 attached to an adjacent cell 20 such as the overlying and/or underlying cell in the cell stack 10. The first transmitter contact pad 62(1) is electrically connected to the electronic device 42 by an electrically conductive second trace 53 that is provided on the first surface 47 of the circuit board 44.

Similarly, the receiver includes a first receiver contact pad 64(1) that is disposed on the circuit board first surface 47 and a second receiver contact pad 64(2) that is disposed on the circuit board second surface 48. The first receiver contact pad 64(1) is electrically connected to the second receiver contact pad 64(2) by a via 65 that passes through the circuit board 44. The first and second receiver contact pads 64(1), 64(2) enable electrical connection to and communication with the receiver of an identical sensor device 40 attached to an adjacent cell 20 such as the overlying cell and/or underlying cell in the cell stack 10. The first receiver contact pad 64(1) is electrically connected to the electronic device 42 by an electrically conductive third trace 55 provided on the first surface 47 of the circuit board 44.

The sensor device 40 includes a positive terminal 66 disposed on the circuit board first surface 47 between the first sensor contact pad 60(1) and the electronic device 42. The positive terminal 66 is electrically connected to the first sensor contact pad 60(1) for example by an electrically conductive fourth trace 57 formed on the circuit board first surface 47. In addition, the sensor device 40 includes a negative terminal 68 disposed on the circuit board second surface 48 between the second sensor contact pad 60(2) and electronic device 42. The negative terminal 68 is electrically connected to the electronic device 42 for example by an electrically conductive fifth trace 58 formed on the circuit board second surface 48 and a via 59. The flexible circuit board 44 electrically isolates the positive terminal 66 disposed on the circuit board first surface 47 from the negative terminal 68 disposed on the circuit board second surface 48.

In addition, the electronic device 42 and the contact pads 60, 62, 64 are all low profile elements, whereby the sensor device 40 as a whole is thin. The sensor device thickness ts, corresponding to the distance between contact surfaces of the contact pads of a given electronic device 42, for example the contact pads 64(1), 64(2) of the receiver 64, is relatively small. For example, in some embodiments, the sensor device thickness ts is less than twice the thickness of the single electrode pair cell 20. For example, in other embodiments, the sensor device thickness ts is less than or equal to the thickness of the single electrode pair cell 20. For example, in still other embodiments, the sensor device thickness ts is less than a thickness of the sealing material layer 36.

For example, in some embodiments, the thickness of the sensor device 40 is less than or equal to the thickness of the cell 20, which is itself thin due to its single electrode pair construction.

The contact pads 60, 62, 64 are arranged on the circuit board 44 so that the contact pads on the first end 45 of the circuit board 44 (e.g., the transmitter and receiver contact pads 62(1), 62(2), 64(1), 64(2)) are configured for communication, and the contact pads on an opposed, second end 46 of the circuit board 44 (e.g., the sensor contact pads 60(1), 60(2)) are configured for sensing functions such as cell voltage sensing and temperature sensing, as well as power transmission.

Referring to FIG. 5, the sensor device 40 is connected to the cell 20 so that at the entire sensor device 40 resides outside the cell 20. In particular, the portion of the sensor device 40 that includes the sensor contact pads 60(1), 60(2) overlies the cell 20 along the cell peripheral edge 23, and the second sensor contact pad 60(2) is electrically connected to an outward facing surface of the cell 20. In the illustrated embodiment, the second sensor contact pad 60(2) is electrically connected to the positive electrode 22 since the cells 20 are stacked in an orientation in which the positive electrode 22 is uppermost. The remainder of the sensor device 40, including portions corresponding to the terminals 66, 68, the electronic device 42, and the transmitter and receiver contact pads 62(1), 62(2), 64(1), 64(2) do not overlie the cell 20 and instead are disposed beside the cell 20.

Figure 6:
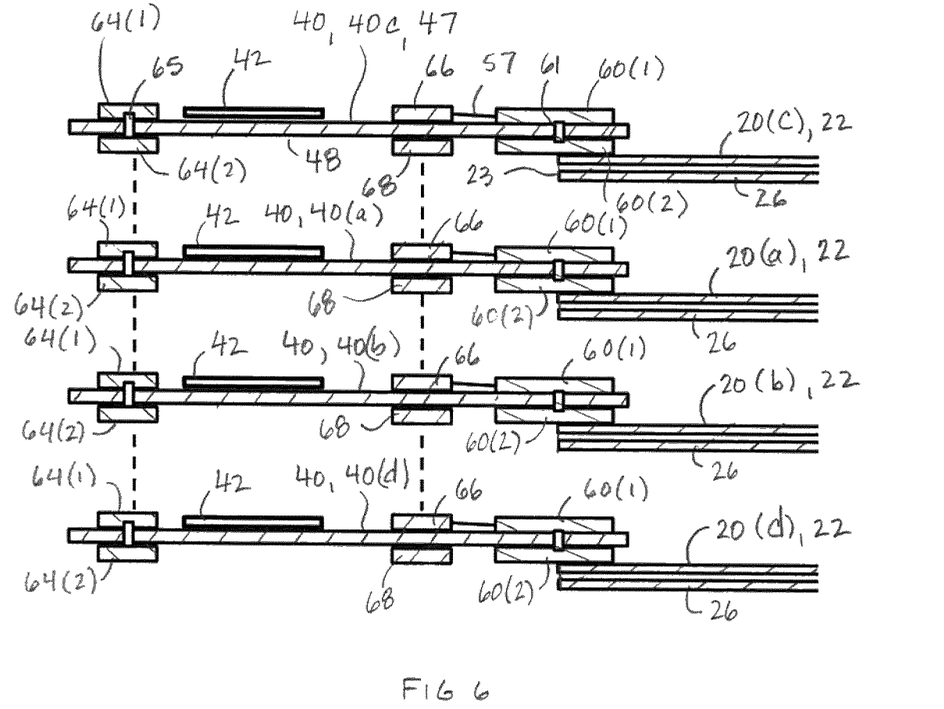
FIG. 6 is a an exploded, cross sectional view of a portion of a cell stack, each cell of the cell stack including the sensor device of FIG. 3, where the sensor devices are arranged so that the sensor devices of adjacent cells contact each other, the contact locations represented by broken lines.

Referring to FIG. 6, in making the series electrical connection between battery cells 20, the cells 20 are stacked atop each other and this allows the sensing devices 40 to make electrical contact with each other for communication purposes. For example, when a first cell 20a and a second cell 20b are stacked in series such that the first cell 20a overlies and is adjacent to the second cell 20b, the corresponding sensing devices (e.g. a first sensor device 40a and a second sensor device 40b) automatically align.

In the aligned configuration, the first sensor contact pad 60(1) of the first sensor device 40a contacts an electrode, for example the negative electrode 26, of the adjacent overlying cell 20c, while the second sensor contact pad 60(2) of the first sensor device 40a contacts an electrode, for example the positive electrode 22, of the first cell 20a. The first sensor contact pad 60(1) of the second sensor device 40b contacts an electrode, for example the negative electrode 26, of the first cell 20a, while the second sensor contact pad 60(2) of the second sensor device 40b contacts an electrode, for example the positive electrode 22, of the adjacent underlying cell 20d.

When cells 20 having a corresponding sensor device 40 are stacked in series, the sensing devices 40, which are disposed between the cells 20, and connected to the cells 20 by the sensor contact pads 60(1), 60(2), are able to draw power from the cells 20. Thus, the battery cell series connection may be used to provide power to the sensor devices 40, enabling the sensor devices 40 to perform both sensing functions and control functions such as controlled electrical draining of the battery cell in order to balance state of charge (SOC).

In the aligned configuration, the first transmitter contact pad 62(1) of the first sensor device 40a contacts the second transmitter contact pad 62(2) of the sensor device 40c of the adjacent overlying cell 20c, while the second transmitter contact pad 62(2) of the first sensor device 40a contacts the first transmitter contact pad 62(1) of the second sensor device 40b. In addition, the second transmitter contact pad 62(2) of the second sensor device 40b contacts the first transmitter contact pad 62(1) of the sensor device 40d of the adjacent underlying cell 20d.

Likewise, the first receiver contact pad 64(1) of the first sensor device 40a contacts the second receiver contact pad 64(2) of the sensor device 40c of the adjacent overlying cell 20c, while the second receiver contact pad 64(2) of the first sensor device 40a contacts the first receiver contact pad 64(1) of the second sensor device 40b. In addition, the second receiver contact pad 64(2) of the second sensor device 40b contacts the first receiver contact pad 64(1) of the sensor device 40d of the adjacent underlying cell 20d.

Figure 7:
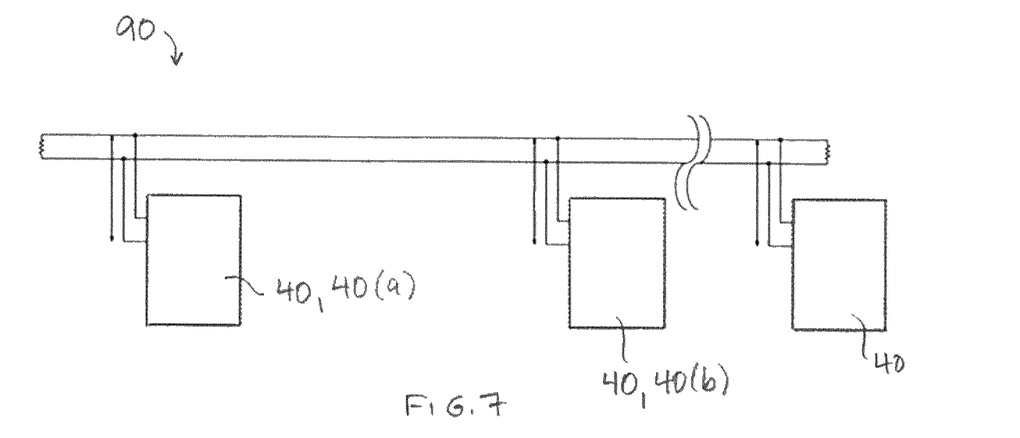
FIG. 7 is a representation of a communication network that is formed automatically when the sensing devices are placed atop one another.

Referring to FIG. 7, a communication network is formed automatically when the cells 20 are in the stacked configuration, which results in the sensing devices 40 being placed atop one another in an aligned configuration. In the aligned configuration, the transmitter contact pads 62 of adjacent sensor devices 40a, 40b form an electrical contact, allowing them to communicate with each other and form a serial network. Likewise, the receiver contact pads 64 of adjacent sensor devices 40a, 40b form an electrical contact, allowing them to communicate with each other and form a serial network. In some embodiments, the transmitters and the receivers are connected in a single, controller area network (CAN) 90 in which the sensor devices 40 are the network nodes. The electrical connection between adjacent sensor devices 40 of the cell stack 10 automatically creates the communication network 90 as well as the individual stubs for the sensor devices 40. Advantageously, the communication network 90 is automatically created during assembly process without the addition of external wiring. The communication network 90 permits communication between cells as well as with other devices including the BMS 80.

Figure 8:
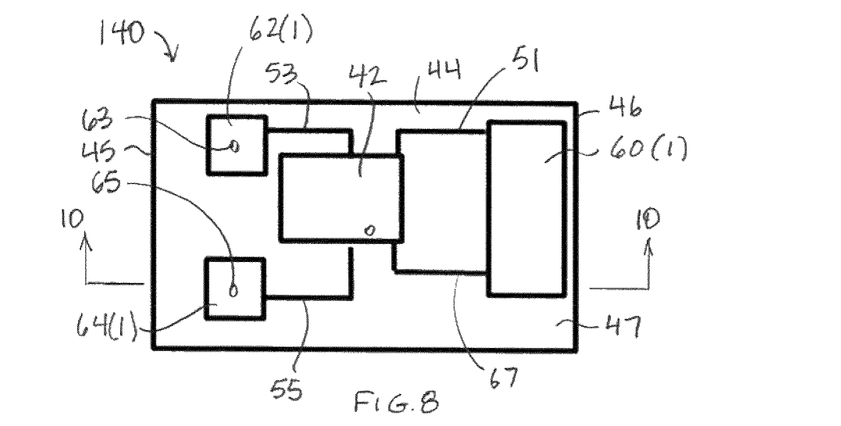
FIG. 8 is a top plan view of an alternative embodiment sensor device.
Figure 9:
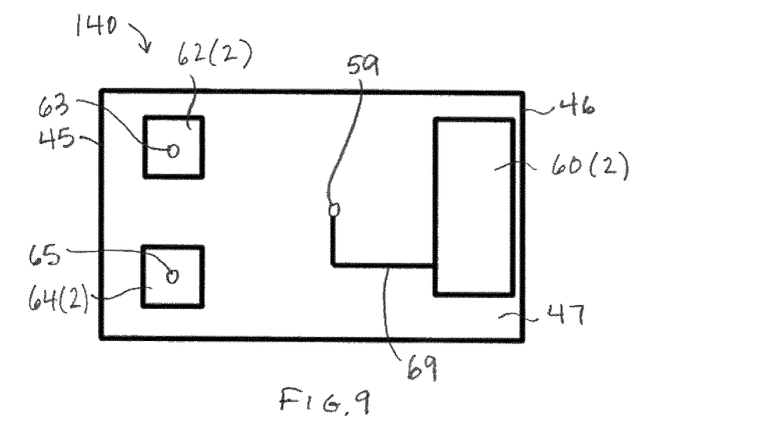
FIG. 9 is a bottom plan view of the sensor device of FIG. 8.

Referring to FIGS. 8-9, an alternative embodiment sensor device 140 is a flexible, low profile device that permits detection of battery cell conditions such as voltage and temperature, and also provides the ability to actively perform functions such as draining of the battery cell energy in order to enable state of charge balancing in a series string of battery cells 20. In addition, the sensor device 140 is configured so that when multiple cells 20 are arranged in a stacked configuration, the respective sensor devices 140 automatically form a communication network without the need for manual connection, welding, etc. These and other features are described in detail below.

The sensor device 140 illustrated in FIGS. 8 and 9 includes many elements that are common with the sensor device 40 described above with respect to FIGS. 3 and 4, and common elements have a common reference number. The alternative embodiment sensor device 140 of FIGS. 8-10 differs from the previously described sensor device 40 in that the positive and negative terminals 66, 68 and corresponding traces 57, 58 are omitted, and the arrangement of the electrically traces between the sensor contact pads 60(1), 60(2) and the electronic device 42 is modified. In particular, the sensor device 140 includes the first trace 51 that is disposed on the circuit board first surface 47 and electrically connects the first sensor contact pad 60(1) to the electronic device 42. In addition, the sensor device 140 includes a sixth trace 67 that is disposed on the circuit board first surface 47 and electrically connects the first sensor contact pad 60(1) to the electronic device 42, and a seventh trace 69 that is disposed on the circuit board second surface 48 and electrically connects the the second sensor contact pad 60(2) to the electronic device 42 by way of the via 59.

Figure 10:
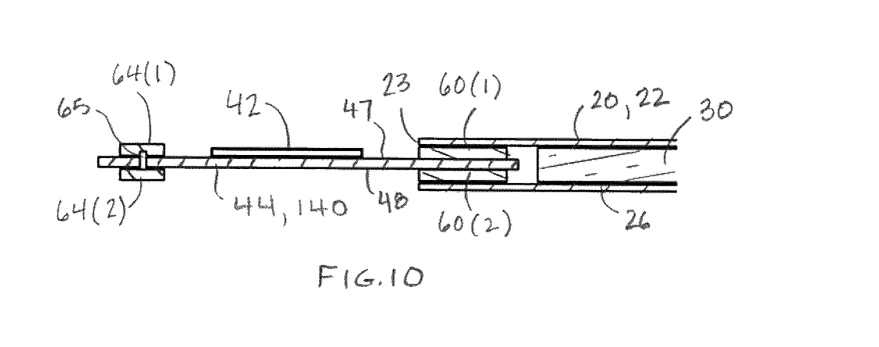
FIG. 10 is a schematic cross-sectional view of the sensor device of FIG. 8 assembled with a cell.

Referring to FIG. 10, the sensor device 140 of FIGS. 8 and 9 further differs from the earlier described sensor device 40 in that sensor device 140 of FIG. 8-10 is connected to the cell 20 so that a portion of the sensor device 140 resides inside the cell 20 while the remainder of the sensor device 140 protrudes outside the cell 20. In particular, the portion of the sensor device 40 that includes the first and second sensor contact pads 60(1), 60(2) resides inside the cell so as to be adjacent to the cell peripheral edge 23. The first sensor contact pad 60(1) contacts and is electrically connected to an inward facing surface of one of the electrodes, for example the positive electrode 22. In addition, the second sensor contact pad 60(2) contacts and is electrically connected to an inward facing surface of the other electrode, for example the negative electrode 26. The sensor device 140 is thus directly powered by the cell 20 to which it is connected. In this configuration, the sensor device 140 draws all of its power from one cell 20, e.g., the cell to which it is attached, since the sensor contact pads 60(1), 60(2) lie in between and directly contact the cell substrates 22, 26.

In some embodiments, the first and second sensor contact pads 60(1), 60(2) are embedded within the sealing material layer 36. In particular, the first and second sensor contact pads 60(1), 60(2) are isolated from the electrolyte within the cell 20 by the sealing material layer 36.

Figure 11:
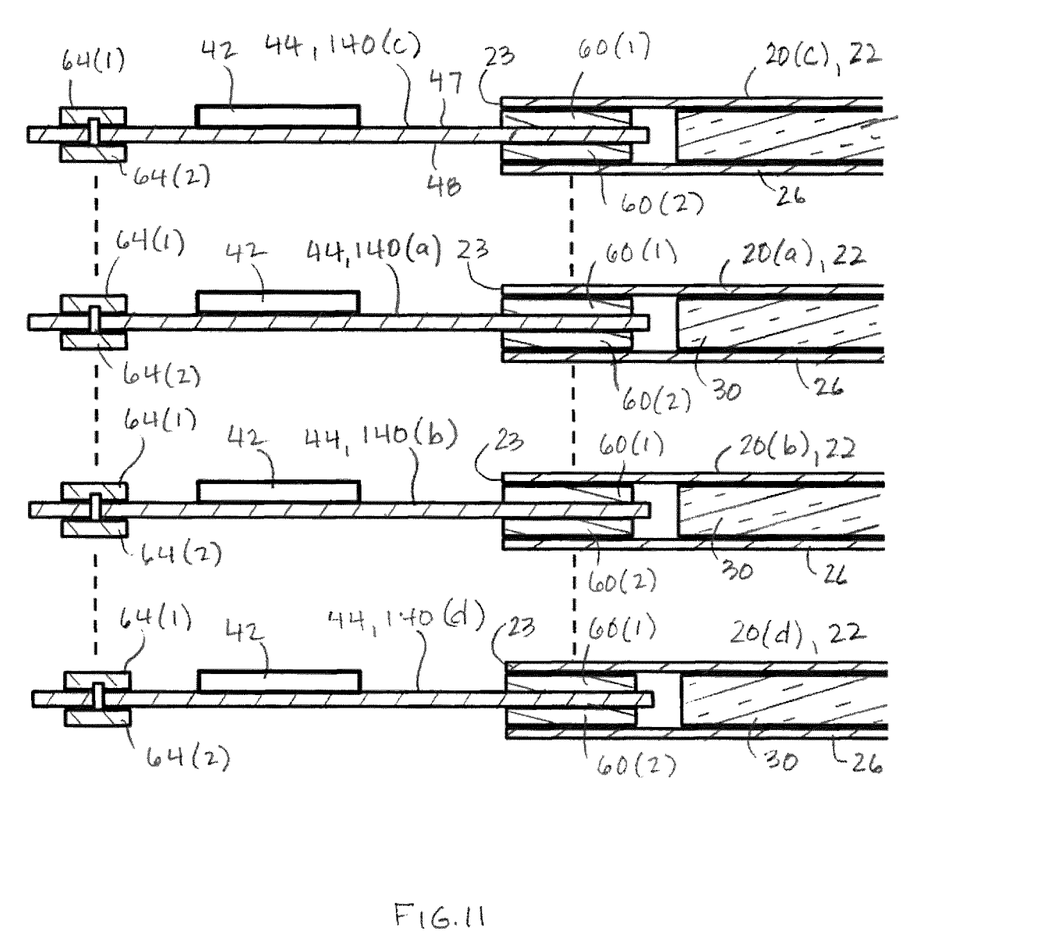
FIG. 11 is a an exploded, cross sectional view of a portion of a cell stack, each cell of the cell stack including the sensor device of FIG. 8, where the sensor devices are arranged so that the sensor devices of adjacent cells contact each other, the contact locations represented by broken lines.

Referring to FIGS. 10 and 11, the remainder of the sensor device 140, including portions corresponding to the electronic device 42, and the transmitter and the receiver contact pads 62(1), 62(2), 64(1), 64(2) reside outside the cell 20 and are disposed beside the cell 20. This configuration permits the automatic formation of a communication network when the cells 20 each include a sensor device 140 and are arranged in a stacked configuration, as discussed above with respect to FIGS. 6 and 7. The physical contact between the sensor device 140a of a given cell 20a and the sensor device 140b of the adjacent cell 20b solely provides the communication network 90.

In some embodiments, an external force is applied to the cell stack in the stacking direction to ensure good contact between adjacent cells 20.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

What is claimed is:

1. An electrochemical cell, comprising a single positive electrode that forms a first portion of an outer surface of the cell and provides a positive cell terminal,
   a single negative electrode that forms a second portion of an outer surface of the cell and provides a negative cell terminal,
   a separator that is disposed between the positive electrode and the negative electrode, wherein the positive electrode, the negative electrode and the separator are arranged in a stacked configuration,
   a sealing material layer that connects and forms a seal between a peripheral edge of the positive electrode and a peripheral edge of the negative electrode, and
   a sensor device including circuit board and an electronic device that is supported on the circuit board, the electronic device including a sensor and a conmunication device,
   wherein
   the sensor device is in physical contact with, and electrically connected to, one of the positive electrode and the negative electrode,
   at least a first portion of the sensor device is disposed outside the cell,
   the sensor device includes a second portion that includes an electrically conductive sensor contact pad that is electrically connected to the sensor, and
   the second portion of the sensor device is disposed on an outer surface of the cell.

2. The electrochemical cell of claim 1, wherein the first portion of the sensor device includes an electrically conductive communication contact pad that is electrically connected to the communication device.

3. The electrochemical cell of claim 1, wherein
   the sensor device includes a second portion that includes an electrically conductive sensor contact pad that is electrically connected to the sensor, and
   the sensor contact pad is entirely disposed within the cell.

4. The electrochemical cell of claim 1, wherein
   the sensor device includes a second portion that includes an electrically conductive sensor contact pad that is electrically connected to the sensor, and
   the sensor contact pad is embedded within the sealing material layer.

5. The electrochemical cell of claim 1, wherein
   the electronic device further includes a transmitter and a receiver,
   the first portion of the sensor device includes an electrically conductive transmitter contact pad that is electrically connected to the transmitter, and an electrically conductive receiver contact pad that is electrically connected to the receiver.

6. The electrochemical cell of claim 1, wherein the circuit board is flexible.

7. The electrochemical cell of claim 1, wherein the electronic device is an integrated circuit that is configured to perform at least one of battery cell monitoring function and battery cell control function.

8. A battery module comprising
electrochemical cells disposed in a stacked configuration, and
sensor devices, each sensor device being electrically connected to a unique one of the electrochemical cells, each sensor device physically contacting, and forming an electrical connection with, the sensor device of an adjacent electrochemical cell so as to automatically form a communication network, wherein
each electrical cell comprises
a single positive electrode that forms a first portion of an outer surface of the cell and provides a positive cell terminal,
a single negative electrode that forms a second portion of an outer surface of the cell and provides a negative cell terminal,
a separator that is disposed between the positive electrode and the negative electrode, wherein the positive electrode, the negative electrode and the separator are arranged in a stacked configuration,
a sealing material layer that connects and forms a seal between a peripheral edge of the positive electrode and a peripheral edge of the negative electrode, and
one of said sensor devices, the one of said sensor devices including a circuit board and an electronic device that is supported on the circuit board, the electronic device including a sensor and a communication device,
wherein
the one of said sensor devices is in physical contact with, and electrically connected to, one of the positive electrode and the negative electrode, and
at least a first portion of the one of said sensor devices is disposed outside the cell,
the one of said sensor devices includes a second portion that includes an electrically conductive sensor contact pad that is electrically connected to the sensor, and
the second portion of the one of said sensor devices is disposed on an outer surface of the cell.

9. The battery module of claim 8, wherein
each sensor device includes a circuit board and communication device that is supported on a first side of the circuit board, the communication device including at least one of a transmitter and a receiver,
each sensor device includes an electrically conductive first contact pad disposed on the first side of the circuit board and an electrically conductive second contact pad disposed on a second side of the circuit board,
the first contact pad is electrically connected to the communication device, the first contact pad and the second contact pad are electrically connected by a via that passes through the circuit board from the first side to the second side, and
one of the first and second contact pads of one electrochemical cell is physically touching and electrically connected to one of the first and second contact pads of an adjacent electrochemical cell, whereby at least a portion of a communication network is automatically formed.

10. The battery module of claim 8, wherein each sensor device is powered by the unique one of the electrochemical cells to which the sensor device is connected.

11. The battery module of claim 8, wherein each sensor device configured to be powered upon formation of a serial connection between adjacent sensor devices.

12. The battery module of claim 8, wherein the battery module includes a module housing, and the electrochemical cells are disposed within the module housing.

13. An electrochemical cell, comprising
a single positive electrode that forms a first portion of an outer surface of the cell and provides a positive cell terminal,
a single negative electrode that forms a second portion of an outer surface of the cell and provides a negative cell terminal,
a separator that is disposed between the positive electrode and the negative electrode, wherein the positive electrode, the negative electrode and the separator are arranged in a stacked configuration,
a sealing material layer that connects and forms a seal between a peripheral edge of the positive electrode and a peripheral edge of the negative electrode, and
a sensor device including circuit board and an electronic device that is supported on the circuit board, the electronic device including a sensor and a communication device,
wherein
the sensor device is in physical contact with, and electrically connected to, one of the positive electrode and the negative electrode,
at least a first portion of the sensor device is disposed outside the cell,
the sensor device includes a second portion that includes an electrically conductive sensor contact pad that is electrically connected to the sensor,
the second portion of the sensor device is disposed between the positive electrode and the negative electrode, and
the second portion of the sensor device physically contacts each of the positive electrode and the negative electrode.

14. The electrochemical cell of claim 13, wherein the sensor contact pad includes a first sensor contact pad that physically contacts and is electrically connected to the positive electrode and a second sensor contact pad that physically contacts and is connected to the negative electrode.

15. A battery module comprising
electrochemical cells disposed in a stacked configuration, and
sensor devices, each sensor device being electrically connected to a unique one of the electrochemical cells, each sensor device physically contacting, and forming an electrical connection with, the sensor device of an adjacent electrochemical cell so as to automatically form a communication network wherein
each electrical cell comprises
a single positive electrode that forms a first portion of an outer surface of the cell and provides a positive cell terminal,
a single negative electrode that forms a second portion of an outer surface of the cell and provides a negative cell terminal,
a separator that is disposed between the positive electrode and the negative electrode, wherein the positive electrode, the negative electrode and the separator are arranged in a stacked configuration, a sealing material layer that connects and forms a seal between a peripheral edge of the positive electrode and a peripheral edge of the negative electrode, and one of said sensor devices, the one of said sensor devices including a circuit board and an electronic device that is supported on the circuit board, the electronic device including a sensor and a communication device, and wherein the one of said sensor devices is in physical contact with, and electrically connected to, one of the positive electrode and the negative electrode, at least a first portion of the one of said sensor devices is disposed outside the cell, the one of said sensor devices includes a second portion that includes an electrically conductive sensor contact pad that is electrically connected to the sensor, the second portion of the one of said sensor devices is disposed between the positive electrode and the negative electrode, and the second portion of the one of said sensor devices physically contacts each of the positive electrode and the negative electrode.

\* \* \* \* \*